(12) United States Patent
Werner

(10) Patent No.: US 10,101,392 B2
(45) Date of Patent: Oct. 16, 2018

(54) SCAN TEST MULTIPLEXING

(71) Applicant: Advantest Corporation, Tokyo (JP)

(72) Inventor: Matthias Werner, Bibertal (DE)

(73) Assignee: Advantest Corporation, Tokyo (JP)

( * ) Notice: Subject to any disclaimer, the term of this patent is extended or adjusted under 35 U.S.C. 154(b) by 204 days.

(21) Appl. No.: 14/796,322

(22) Filed: Jul. 10, 2015

(65) Prior Publication Data

US 2016/0011261 A1    Jan. 14, 2016

Related U.S. Application Data

(60) Provisional application No. 62/029,975, filed on Jul. 28, 2014, provisional application No. 62/023,734, filed on Jul. 11, 2014.

(51) Int. Cl.
| | |
|---|---|
| *G01R 31/319* | (2006.01) |
| *G01R 31/3185* | (2006.01) |
| *G01R 31/3177* | (2006.01) |
| *G01R 31/317* | (2006.01) |
| *G01R 31/28* | (2006.01) |

(52) U.S. Cl.
CPC ............ *G01R 31/31926* (2013.01); *G01R 31/318563* (2013.01); *G01R 31/2851* (2013.01); *G01R 31/3177* (2013.01); *G01R 31/31723* (2013.01); *G01R 31/31727* (2013.01); *G01R 31/318536* (2013.01); *G01R 31/318547* (2013.01); *G01R 31/318558* (2013.01); *G01R 31/318569* (2013.01); *G01R 31/318575* (2013.01)

(58) Field of Classification Search
CPC ........ G01R 31/3177; G01R 31/318536; G01R 31/318547; G01R 31/31723; G01R 31/31727; G01R 31/2851; G01R 31/318575; G01R 31/318558; G01R 31/31926; G01R 31/318569
See application file for complete search history.

(56) References Cited

U.S. PATENT DOCUMENTS

| | | | | |
|---|---|---|---|---|
| 4,701,921 A | * | 10/1987 | Powell ........... | G01R 31/318558 714/727 |
| 4,710,931 A | * | 12/1987 | Bellay ............ | G01R 31/318558 714/730 |
| 5,173,904 A | * | 12/1992 | Daniels .......... | G01R 31/318536 714/729 |
| 7,734,966 B1 | | 6/2010 | Lee et al. | |
| 2014/0264331 A1 | | 9/2014 | Yao et al. | |
| 2016/0011262 A1 | | 1/2016 | Werner | |

* cited by examiner

*Primary Examiner* — April Y Blair
*Assistant Examiner* — Sazzad Hossain

(57) ABSTRACT

System and method for performing scan test on multiple IC devices by site-multiplexing. Multiple test sites of an ATE are coupled to multiple DUTs through a multiplexer. A scan test includes a scan-in/out phase and consecutive launch/capture cycles. Each site performs scan in/out in parallel on the corresponding DUT. In each launch/capture cycle, a respective site drives/captures data from a DUT while the remaining sites are inactive. The multiplexer allows the active site to borrow test channels assigned to other test sites such that all the test data of a DUT can be driven/captured in the launch capture cycle despite the test channel limitation of the active test site. As the tester channels receive interleaved data of the multiple sites, each strobe edge of a receive channel is assigned to a particular test site and used to quickly identify a failure site without post-processing test data.

20 Claims, 7 Drawing Sheets

SCAN TEST MULTIPLEXING

CROSS REFERENCE

The present patent application claims priority to the U.S. provisional patent application No. 62/023,734, filed on Jul. 11, 2014, titled "Smart Scan Multiplexing" and the U.S. provisional patent application No. 62/029,975, filed on Jul. 28, 2014, titled "Fast Pattern Multiplexing." The foregoing patent applications are incorporated by reference in entirety for all purposes.

TECHNICAL FIELD

The present disclosure relates generally to the field of automated test equipments (ATE) of integrated circuit (IC) devices, and more particularly, to scan testing of IC devices.

BACKGROUND

In semiconductor manufacturing, an automatic test equipment (ATE) is used to test integrated circuit (IC) devices (known as the Devices Under Test (DUTs)) e.g., to characterize electrical properties, detect abnormalities, and evaluate product quality. During test operations, test signals are provided to the DUT and the resultant output signals generated from the DUT are evaluated against expectation values.

FIG. 1 illustrates the configuration of an IC device 110 and the timing diagrams in a scan test performed on an ATE. For example, the scan test may implement a stuck-at or delay test scan application. Pertinent to the scan test, the IC device 110 includes parallel input/output (IO) pins 101, combinational logic 103, and scan chain flip-flops (scan chain FF) 105.

During the scan shift phase in the scan test, the scan data is shifted into the scan chain flip flops (scan chain-FF) 105 through scan shift cycles 121. At the same time, the scan data of the previous shift phase is shifted out of the scan chain FF 105. After all data has been shifted in, a system clock pulse 122 ("launch clock") triggers releasing of the scan data from the flip flops 105. The data propagates through the combinational logic 103 to the input of scan-FF 105. A second clock pulse 123 ("capture clock") triggers capturing the data into the scan-FF 105. Regarding the data communication between the DUT and the tester, a capture clock (as shown) is used to latch-in data from the tester into the DUT; while during a launch clock phase (as shown) a tester strobe edge is used to latch-in data coming from the DUT into the tester The combinational logic 103 on the outer side of the device 110 may or may not be surrounded by scan-FF. In case they are not, the data are supplied from the associated tester system (not shown) through the device parallel IO pins 101 prior to the Capture clock 123 by a setup time (Tsu).

Similar for the data which comes out of the combinational logic 103, the data are "strobed" into the ATE system channels (or tester channels) after the Launch clock 122 by a propagation delay time (Tpd), which are connected to the parallel IO 101 pads of the device 110.

To keep up with the increasing demands for higher throughput of IC devices, state-of-the-art ATEs have to be equipped with sufficient test channels for coupling to the parallel IO pins of the DUTs. This contributes to substantial capital cost of overall cost of the test system and device production. For example, relatively large digital devices typically have 100-400 input/output (I/O) pins. However, most of these IO pins are only utilized in about 20% of the overall test blocks. Adding tester channels for all these IO pins would translate into high additional capital cost for test equipments even though utilization of these pins is rather low.

Another solution for overcoming the ATE test channel limitation is to multiplex the parallel IO pins of a DUT to the ATE test channels in scan tests. FIG. 2 illustrates multiplexing configuration between a DUT 210 and a test system 220 (or "tester") and a scan test sequence 240 of a multiplexing scan test in accordance with the prior art. The test system 220 may provide fewer test channels 221 than the primary IO pins of the DUT 210. As shown, the DUT pins 203 and 204 are used for scan-in and scan-out and connected to the test system 220 without using a multiplexer. The DUT primary parallel IO pins are divided into two groups 201 and 202, both groups coupled to a single test site of the test system 220 through a 2:1 multiplexer 230. The multiplexer 230 is normally located on the test load board (adapter board between device and test system).

In this configuration, a scan test for the device needs to be performed twice in order for the tester 220 to collect all the device response data from both groups of IO pins 201 and 202. This is because the capture clock occurs only once in a scan shift in/out phase.

Specifically, in the first test execution, as illustrated in diagram 250, the multiplexer 230 couples the first group of the primary device IO pins 201 to the test channels 221 and a scan test is performed. In this run, only a few devices pads are connected to the tester through 201. The remaining devices pins need the multiplexer 230 switch to connect to 202 Therefore, the same test pattern has to be executed for a second time while the multiplexer is switched such that the second group pins 202 are coupled to the test channels 221, as shown in diagram 260.

The diagram 240 illustrates the tester sequence for this scan test. The "scan in/out" boxes (e.g., 241 and 242) and "parallel" boxes (e.g., 243) represent the test sequencer. As illustrated by the box widths, the scan in/out operations need only a few tester channels (e.g., 241 and 242); while for the "parallel" launch/capture cycle many tester channels (e.g., 243) are needed.

The example in FIG. 2 demonstrates that, although the conventional multiplexing scan test approach reduces the requirement for the number of test channels in the tester, the associated capital cost saving is unfortunately achieved at the expense of multiplying scan test time. For instance, doubling the scan test time typically results in the overall test time increased by a factor of 10-30%, and consequently the test throughput is decreased by the same amount. Further, this multiplexing approach may offer less test coverage compared to a non-multiplexed solution because there will be corner paths that may require primary IO input data from both executions.

SUMMARY OF THE INVENTION

Accordingly, it would be advantageous to provide a mechanism that allows an ATE system with limited test channels to perform a scan test on a DUT having a greater number of primary input/output (IO) pins with high test time-efficiency.

Embodiments of the present disclosure employ a multiplexer to couple the primary IO pins of multiple DUTs to multiple test sites of a test system for a scan test. The input/output of the multiplexer is divided into a number of blocks and spanned across the same number of test sites of a test system. Each block is assigned to a respective DUT but can be switched to (or actively connected to) all the test sites. The test process for a scan pattern includes a scan in/out phase followed by a consecutive sequence of launch/capture phases for respective test sites. During the single scan in/out phase of a scan test, all the test sites can perform scan in/out in parallel on the corresponding DUTs. Whereas, in each launch/capture phase, the multiplexer selectively couples a respective DUT to an active site through the test channels of all the sites, while the remaining sites are placed on a "hold" state. Thus, the active test site can use the test channels assigned to multiple test sites to drive/receive data in the launch/capture phase cycle of the site.

As a result, by borrowing test channels assigned to other test sites, each test site is advantageous capable of capturing all the test data from a DUT in a launch/capture cycle despite the limited test channels for the individual site. Moreover, because each test site has a separate launch/capture cycle, especially a separate capture clock, the multiple sites can sequentially capture/drive data from/to respective DUTs in consecutive launch/capture phases following a single scan-in/out phase in which all sites operate in parallel. As the launch/capture cycles are normally short (compared to a scan-in/out phase) and the multiplexer can switch quickly, the multiple sites effectively can function substantially in parallel in a scan test, which advantageously eliminates the need for executing a scan pattern more than once, thus saving test time.

Due to the multiplexing, the tester channels are shared across multiple sites and so receive interleaved data from the sites. Embodiments of the present disclosure use different strobe edges of the tester receiving channels to identify a failure site, each strobe edge assigned to a particular test site. In some embodiments, a tester offers a single register FAIL bit for each strobe edge. At the end of a test, the read out this single hardware register is used to determine if an error occurred at a particular receive edge at all. In this manner, the failed test site can be identified quickly following the test without post-processing a huge amount of interleaved test data, further improving the test throughput.

According to one embodiment of the present disclosure, a system for testing devices under test (DUTs) includes a first test site, a second test site, a multiplexer and test logic. The first test site includes a first plurality of channels operable to be allocated between first and second DUTs during parallel data launch and capture (or "launch/capture"). A second test site includes a second plurality of channels operable to be allocated between the first and second DUTs during parallel data launch/capture. The multiplexer is operable to selectively couple input/output (I/O) pins of the first DUT or I/O pins of the second DUT to the first and second plurality of channels. The tester logic is operable to perform a test method including: (a) the first and second test sites performing scan operations in parallel where the first test site performs scan operations with respect to the first DUT and the second test site performs scan operations with respect to the second DUT; (b) the first and second test sites performing scan launch/capture of the first DUT while the second DUT is placed on hold and while further the multiplexer couples the first and second plurality of channels to the I/O pins of the first DUT; and (c) the first and second test sites performing scan launch/capture of the second DUT while the first DUT is placed on hold and while further the multiplexer couples the first and second plurality of channels to the I/O pins of the second DUT. The scan launch/capture of the first DUT and the second DUT may be performed responsive to respective scan launch/capture clocks of the first DUT and the second DUT.

According to another embodiment of the present disclosure, a method of testing a first and second DUT includes (1) a first test site, including a first plurality of channels, performing scan operations with respect to the first DUT; (2) a second test site, including a second plurality of channels, performing scan operations with respect to the second DUT; (3) performing a first scan capture phase, responsive to a capture clock for the first DUT; and (4) performing a second scan capture phase, responsive to a capture clock for the second DUT. The first scan capture phase including: (1) placing the second DUT in a hold state; (2) multiplexing channels of the first and second plurality of channels to I/O pins of the first DUT; and (3) performing a scan capture operation on the first DUT utilizing the first and second test sites. The second scan capture phase including: (1) placing the first DUT in a hold state; (2) multiplexing channels of the first and second plurality of channels to I/O pins of the second DUT; and (3) performing a scan capture operation on the second DUT utilizing the first and second test sites.

This summary contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Figure 1:
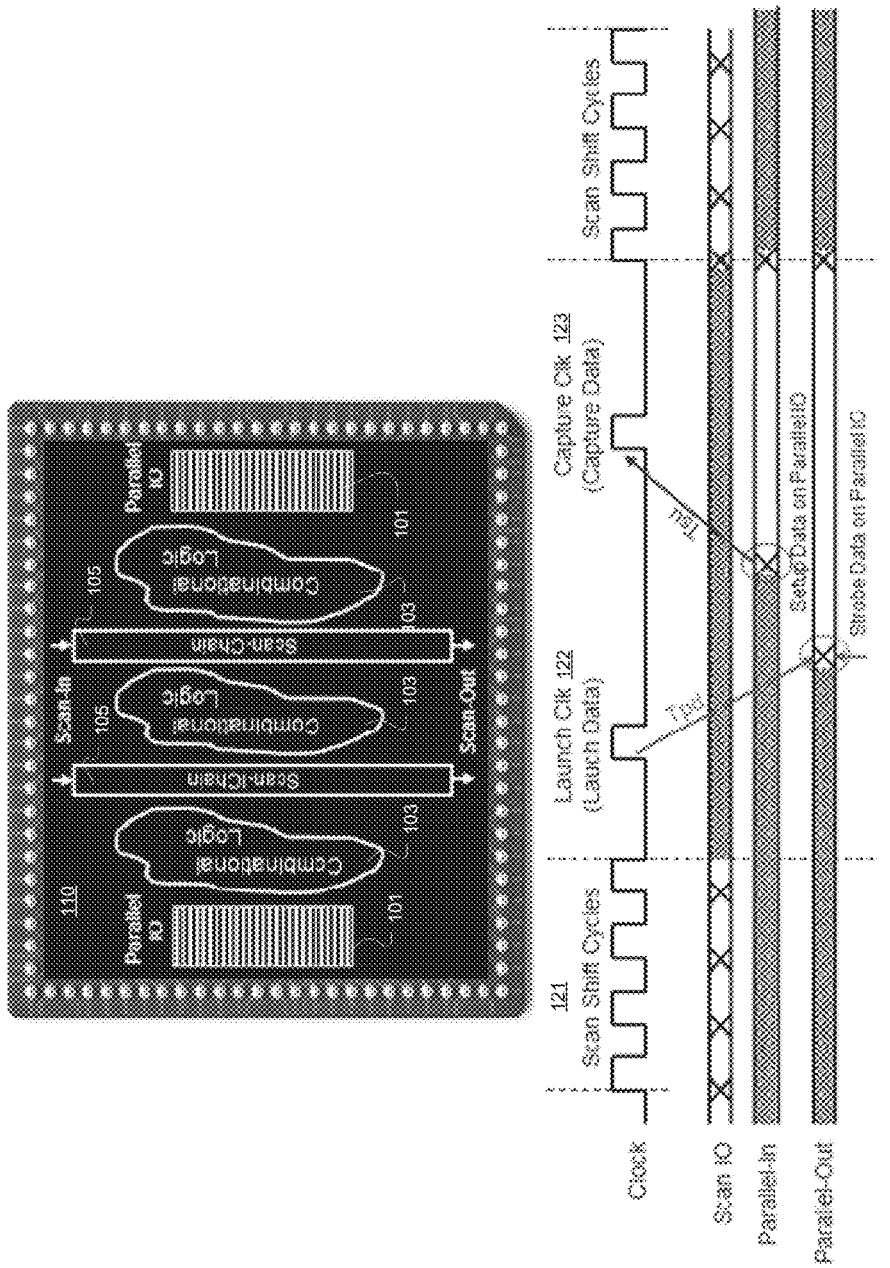
FIG. 1 illustrates the configuration of an IC device and the timing diagrams in a scan test performed on an ATE.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or client devices. When a component appears in several embodiments, the use of the same reference numeral signifies that the component is the same component as illustrated in the original embodiment.

Scan Test Multiplexing

Overall, embodiments of the present disclosure provide automated system and method for scan test on integrated circuit (IC) devices. Multiple test sites of an automated test system (ATE) are coupled to multiple devices under test (DUTs) through a multiplexer. A scan test includes a single scan-in/out phase followed by consecutive launch/capture cycles. In the scan in/out phase, the multiple test sites can perform scan in/out in parallel on the corresponding DUTs. In each launch/capture cycle, a respective test site actively drives/captures data from the corresponding DUT while the remaining sites are placed on "hold." The multiplexer allows the active site to borrow test channels assigned to other test sites such that all the test data of a DUT can be driven/ captured in a launch capture cycle despite the test channel limitation of the active test site. Due to the multiplexing across multiple sites, the tester channels receive interleaved data of the multiple sites. Each strobe edge of the tester receiving channels is designated to a particular test site and used to quickly identify a failure site in real time during the scan test.

Figure 3:
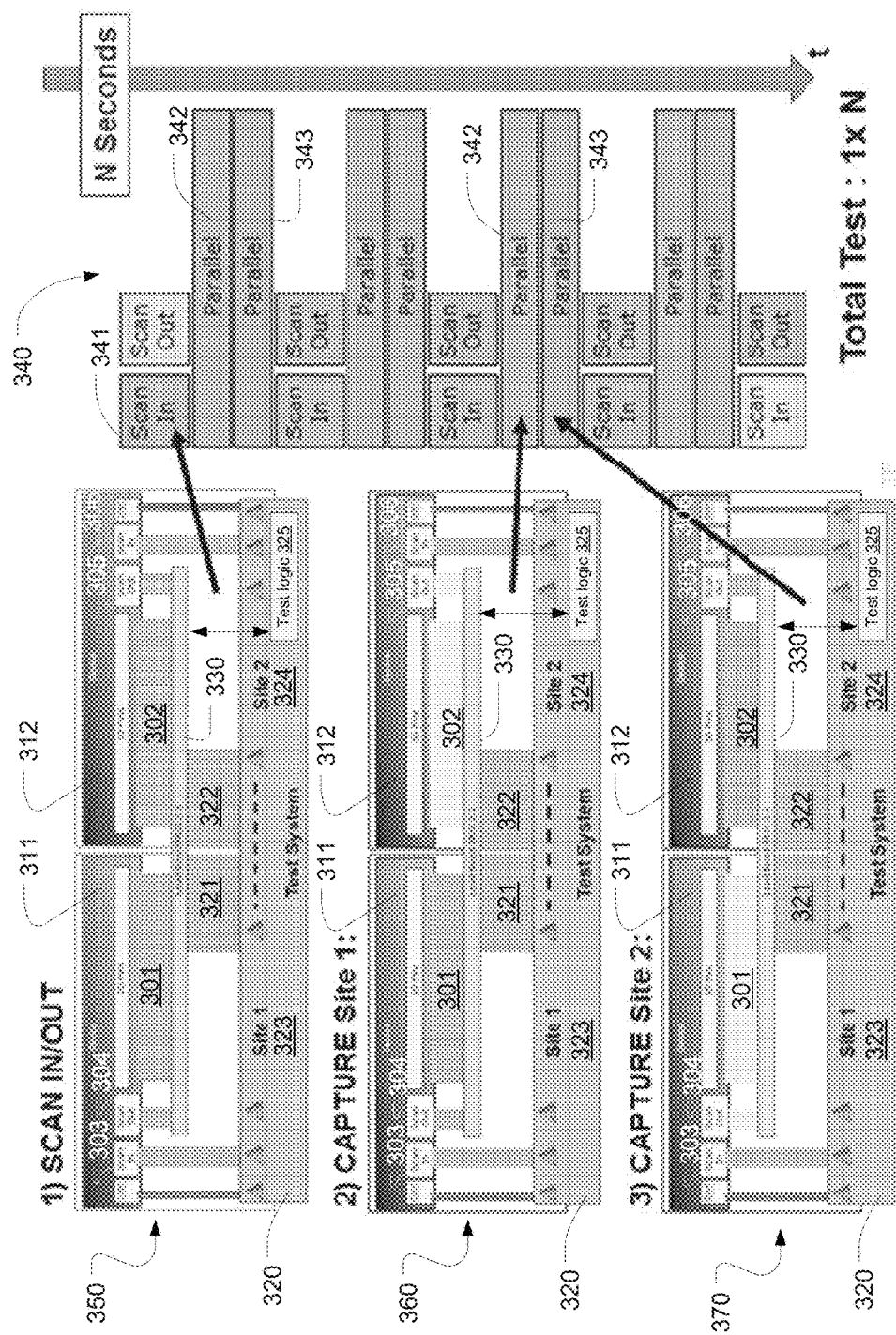
FIG. 3 illustrates an exemplary multiplexing configuration between DUTs and a test system and an exemplary test sequence in a multi-site multiplexing scan test in accordance with an embodiment of the present disclosure.

FIG. 3 illustrates an exemplary multiplexing configuration between DUTs 311 and 312 and a test system 320 and an exemplary test sequence 340 in a multi-site multiplexing scan test in accordance with an embodiment of the present disclosure. In this example, the test system 320 has two neighbor test sites 323 and 324, each site assigned to a respective DUT 311 or 312 and having fewer tester channels than the primary IO pins of the DUT. However, the present disclosure it not limited to such applications.

The test logic 325 may be implemented as hardware, software or a combination thereof. The test logic 325 is configured to control various components of the test system, including the multiplexer, test sites and test channels, to perform multi-site multiplexing scan tests as provided herein.

As shown, the DUT scan-in pins 303 and 306 are coupled to the respective sites 323 and 324 without passing a multiplexer. However, in some other embodiments, the scan-in pins may go through a multiplexer as well. During parallel launch/capture, the scan-in pins may as well carry "parallel" data. The scan-out pins 304 and 305 and parallel IO pins 301 and 302 of both DUTs are coupled to the respective sites 323 and 324 through a 2:1 multiplexer 320. The input/output of the multiplexer 330 is divided into two blocks and spanned across both sites 323 and 324. Accordingly to the present disclosure, each multiplexer block can be switched to (or actively connected to) both test sites 323 and 324, which allows an active site to borrow the test channels from another site that is placed on hold, as described in greater detail below.

The test process for a scan pattern includes a single scan in/out phase (e.g., 341), a launch/capture site 1 phase (e.g., 342) and a launch/capture site 2 phase (e.g., 343) in sequence. During the scan in/out phase, as shown in diagram 350, the first block of the multiplexer 330 are connected to test site 1 323 and the second block is connected to the test site 324. With this connection, each test site can perform scan in/out in parallel on the corresponding DUT.

In the launch/capture phase of test site 1, both multiplexer blocks are connected to test site 1 323, while test site 2 324 are placed on a "HOLD" (or inactive) state, as shown in diagram 360. Site 1 323 can use the tester pins that were assigned to site 2 324 in the scan in/out phase to expand the number of usable tester channels for DUT 311. All the pins on site 1 323 are now coupled to the test channels and can drive/receive data on the launch/capture cycle of site 1 323.

By the same token, in the launch/capture phase of test site 2, both multiplexer blocks are coupled to test site 2 324, while test site 1 323 are placed on a "HOLD" state, as shown in diagram 370. Thus, site 2 324 can use the pins that were assigned to site 1 323 in the scan in/out phase to expand the number of usable tester channels for DUT 312. All the pins on site 2 324 are now connected to the test channels and can drive/receive data on the launch/capture cycle of site 2 324.

Figure 4:
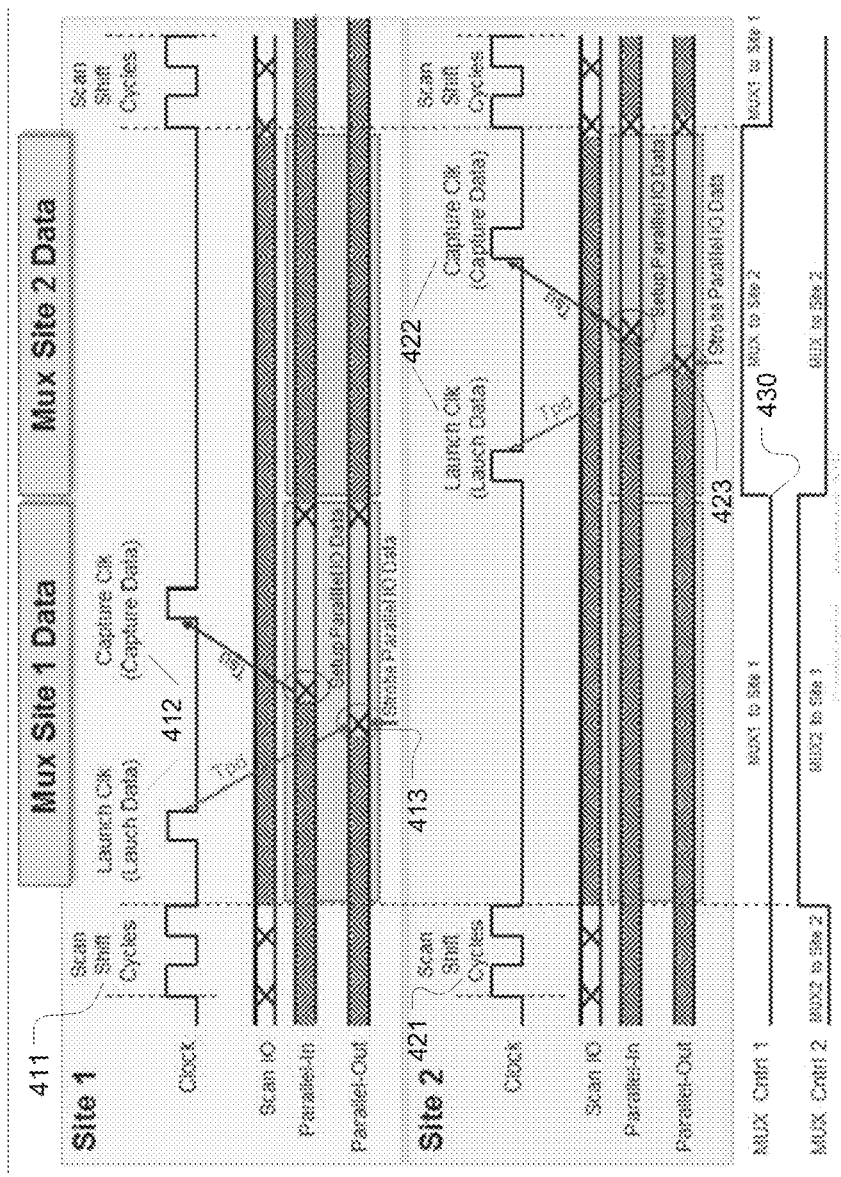
FIG. 4 illustrates the exemplary timing diagrams of the two test sites in a scan test shown in FIG. 3 according an embodiment of the present disclosure.

FIG. 4 illustrates the exemplary timing diagrams of the two test sites in a scan test shown in FIG. 3 according an embodiment of the present disclosure. FIG. 4 shows that the scan shift cycles 411 and 421 are performed for both test sites in parallel. Compared to the launch/capture cycle 412 of test site 1, the launch/capture cycle 422 of test site 2 is delayed. The multiplexer is switched in between launch/ capture cycles 412 and 422, as shown by the timing diagrams of "MUX Cntrl 1" and "MUX Cntrl 2." The multiplexer is under full tester control as well as the test data which is driven/received from the DUT, contributing to a predictable test setup.

FIG. 4 shows that the tester receiving channels strobe-in data two times at 413 and 423, respectively. Multiple sites can sequentially capture data from respective DUTs in consecutive launch/capture phases following a single scan-in/out phase in which all sites operate in parallel. This advantageously eliminates the need for executing the scan pattern more than once as would be performed according to the conventional multiplexing approach, thus saving test time.

Figure 2:
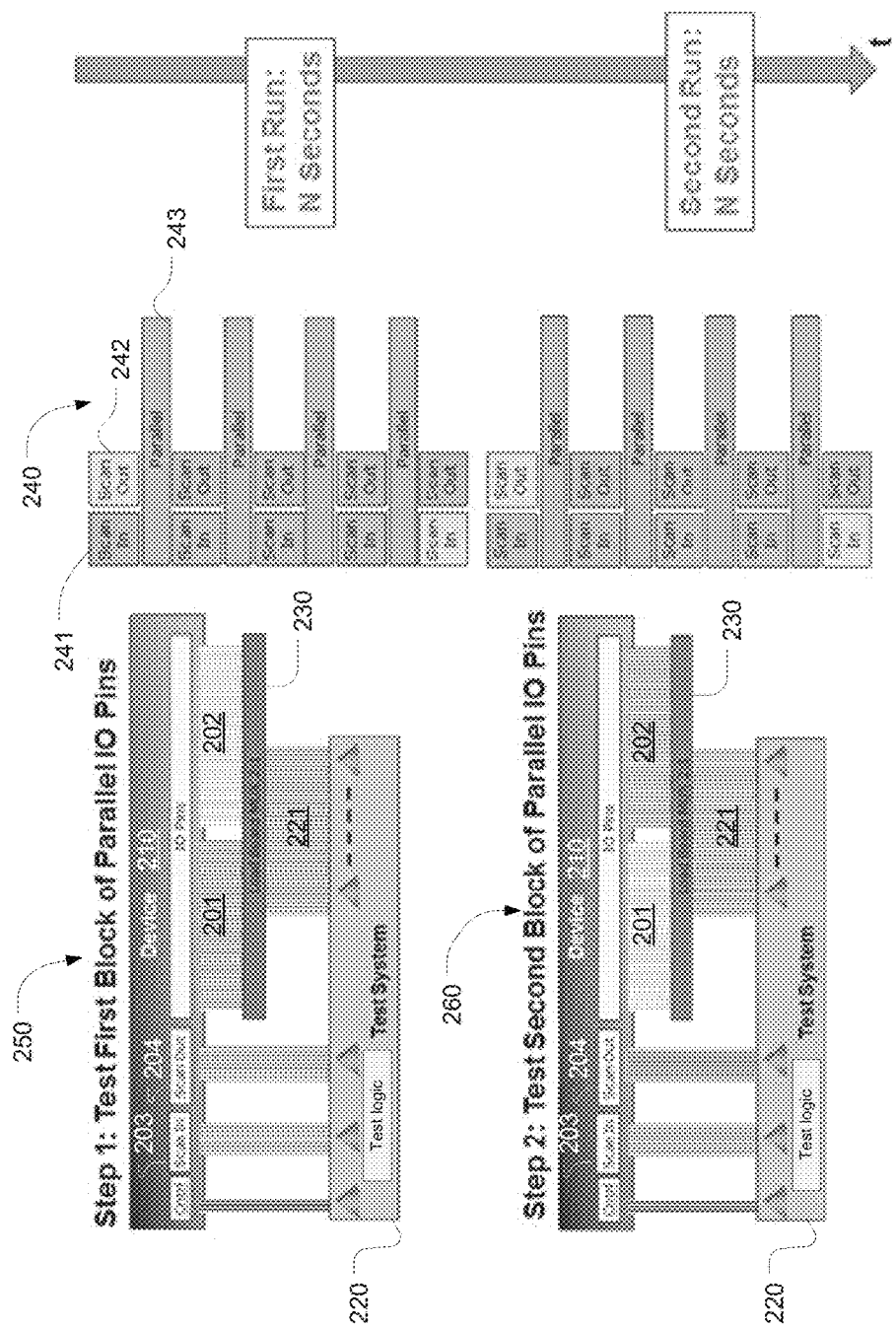
FIG. 2 illustrates multiplexing configuration between a DUT and a test system and a scan test sequence of a multiplexing scan test in accordance with the prior art.

Because the launch/capture cycles are normally short (typically just one test vectors long) and the multiplexer can switch fast, while the scan in/out phase are typically much longer (e.g., hundreds of cycles), the multiplexing of one launch/capture cycle does not significantly contribute to the overall test time. The test time can be nearly the same as for a non-multiplexed solution. In effect, the multiple sites in effect function substantially in parallel in a scan test. Therefore, compared to the conventional multiplexing approach shown in FIG. 2, embodiments of the present disclosure can similarly save capital tester cost, but does not trade-in test time.

Particularly, a DUT is usually designed to be tested in a non-multiplexed manner. A conventional multiplexing approach as described above tends to comprise test coverage of such a DUT, e.g., there might be nodes in the DUT not fully tested. In contrast, a multiplexed test approach according to the present disclosure does not compromise test coverage. In a test, the launch/capture cycles of the two sites are delayed, and from a test point, this resembles a non-multiplexed test and does not negatively affect test coverage.

Although exemplary embodiments are described in detail with reference to multiplexing two DUTs across two test sites, the present disclosure is not limited by the number of test sites or DUTs that can be multiplexed and tested concurrently. It will be appreciated by those skilled in the art that the configuration of a multiplexer may vary in different embodiments with the number of sites or DUTs that can be tested in parallel. The multiplexer can be a N:1 multiplexer with N being any practical number. The multiplexer may include multiple multiplexer units arranged in any structure that is well known in the art, e.g., a tree structure. The multiplexer may be disposed in a loadboard of a tester.

In some embodiments, the multiplexing logic may be embedded in the DUT. For example, the two DUTs coupled to the same plurality of test channels can alternatively switch their output to high impedance for multiplexing. This allows feeding two DUT pins to one test channel, further saving the capital cost associated with test channels on a tester.

In some other embodiments, the present disclosure can be implemented in a separate apparatus independent of a loadboard and coupled between the tester and the DUT.

The present disclosure is not limited to multiplexing test data from multiple devices using multiple test sites. In some of embodiments, test data to and from multiple logic blocks in a single DUT can be multiplexed, e.g., on one test site of the tester.

In another aspect of the present disclosure, after a test is performed, the test system needs to identify whether a detected failure occurs in test site 1 or test site 2 during the test pattern execution. Due to the multi-site multiplexing, the tester channels coupled to the multiplexer receive data from both test sites in the launch/capture phases. The test result of both test sites is therefore stored as "interleaved" data in the tester channel.

The result of all test cycles for both test sites may be captured and post-processed after test. However, this approach is usually time-consuming and requires large tester memory. First, there is a high amount of data generated during a scan test. Storing all the data takes a lot of tester memory. Transferring the data from the tester hardware and doing a post processing takes a lot of time.

As described in greater detail below, embodiments of the present disclosure enable a decision as to which of the test site passed or failed to be made instantaneously. For normal applications, tester pins are assigned to dedicated test sites. Conventionally, they are not alternated between two test sites. Therefore, if a tester channels shows an error, this error can be clearly directed to a particular test site.

To quickly determine a pass or fail result, modern tester architecture provides a hierarchical data compression structure of how error data is stored. For test time reason it is critical to determine quickly if a device is good (pass) or bad (fail).

The data coming from a DUT is compared against expected data stored in the tester channel memory. Any violation between received and expected data can be stored in the tester memory. At the same time, a single bit is set in the channel FAIL register at the first occurrence of a FAIL in the appropriate tester channel. The tester channel FAIL bit is hardwired across all tester channels to a "global" pass/fail bit. It takes a single hardware register read of the "global" pass/fail bit to determine, if any tester channel failed, independent of the number of tester channels and test pattern length. The failing tester channels can be identified from a read out of the channel FAIL register for each channel, which is usually time-consuming. In some embodiments, to get pass or fail information quickly, the data comparison and compression into single fail bits can be performed using hardware only.

This technique does not work for "interleaved" test result which is processed in a tester channel. The tester channels are not able to distinguish data coming from test site 1 or test site 2. Consequently, it cannot identify which site fails if a tester channel shows a fail in its FAIL register.

Embodiments of the present disclosure use different strobe edges of the tester receive channels. For example, a tester may offers 8 receive strobe edges which can be programmed by the user. Strobe edges are used to strobe-in the data coming from the device at a certain point in time. This data is then compared against expected data in the tester channel hardware.

The test can be configured in such a way that data coming from test site 1 uses tester receive strobe edge 1 while data coming from test site 2 uses another edge, e.g. receive strobe edge 2. In some embodiments, a tester offers a single register FAIL bit for each of the 8 receiver strobe edges. This per edge fail bit is set at the occurrence of the first fail seen at a particular receive edge. At the end of test, the read out of this single hardware register is used to determine if an error occurred at a particular receive edge at all. In some scenarios, it may not be important to determine when a fail occurred, but rather whether it occurred. If a particular receive edge is now assigned in the test setup for data coming of a particular site, the failed test site can be quickly identified without processing a huge amount of data.

The multiplexer can be controlled by the tester drive channel, and so the test pattern at any point in time can be related to the direction of the multiplexer.

A method of using programmable edge numbers to labeling data from a DUT according to the present disclosure can be applied in various types of IC device tests, including but not limited to scan testing. The data in and out from DUT may be parallel data of a scan test or may be any other types of test data.

Figure 5:
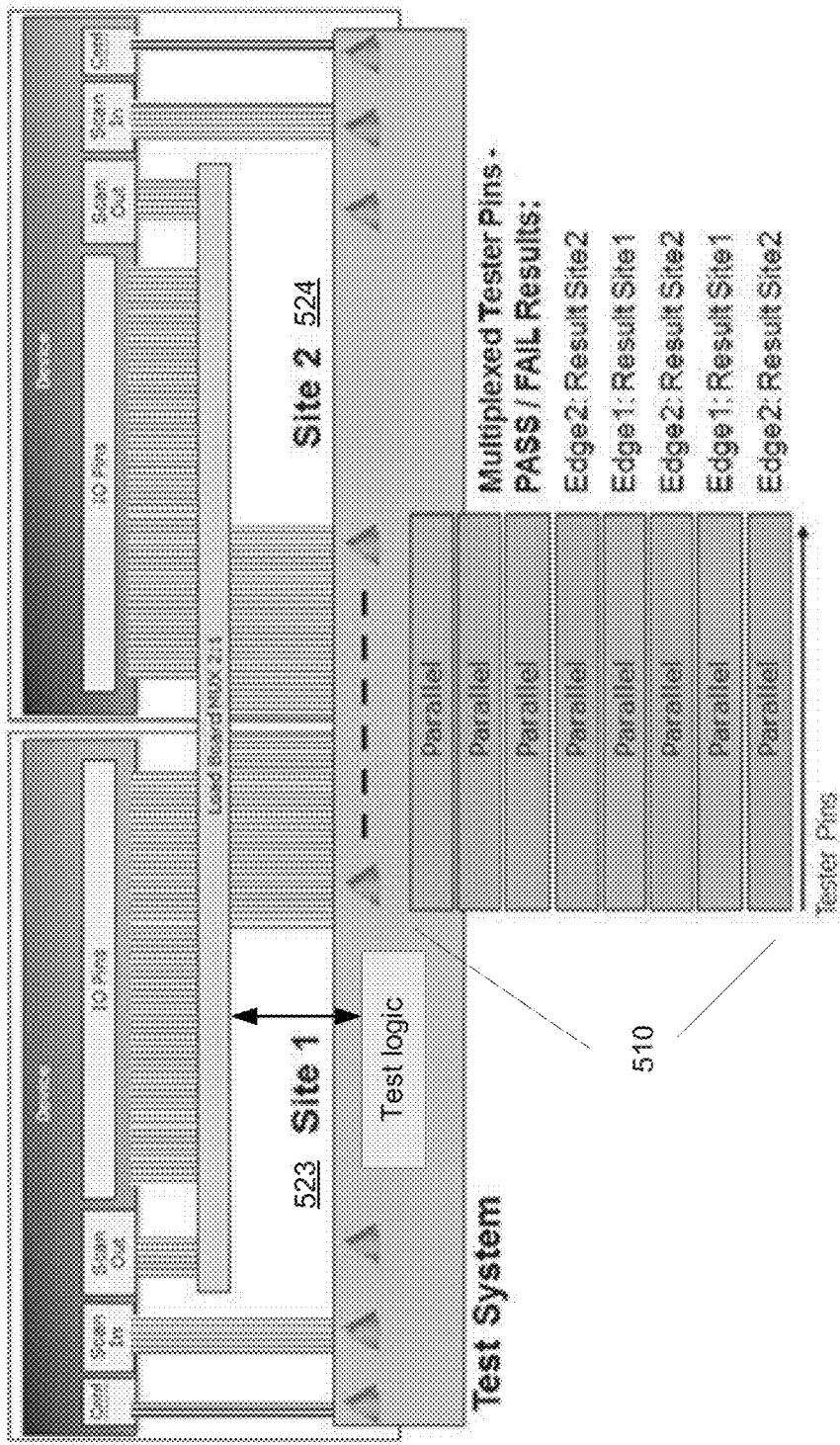
FIG. 5 illustrates the interleaving parallel IO data and the associated strobe edge numbers at the tester channel hardware resulted from a multi-site multiplexing scan test in accordance with an embodiment of the present disclosure.

FIG. 5 illustrates the interleaving parallel IO data and the associated strobe edge numbers 510 at the tester channel hardware resulted from a multi-site multiplexing scan test in accordance with an embodiment of the present disclosure. In this example, the test is configured such that data coming from test site 1 523 uses tester receive strobe edge 1 and data coming from test site 2 524 uses receive strobe edge 2. The test data from the two sites are interleaved and per-site pass/fail results are available in test channels. The Pass/fail result of each site is strobed using different tester received edges. At the end of a test, the tester hardware can instantly provide information if an edge received a "fail" indication.

Therefore, according to the present disclosure, failing test sites can be identified without requiring huge test data capture, transfer and processing. A simple register read out can determine the failing site without any test time penalty.

Figure 6:
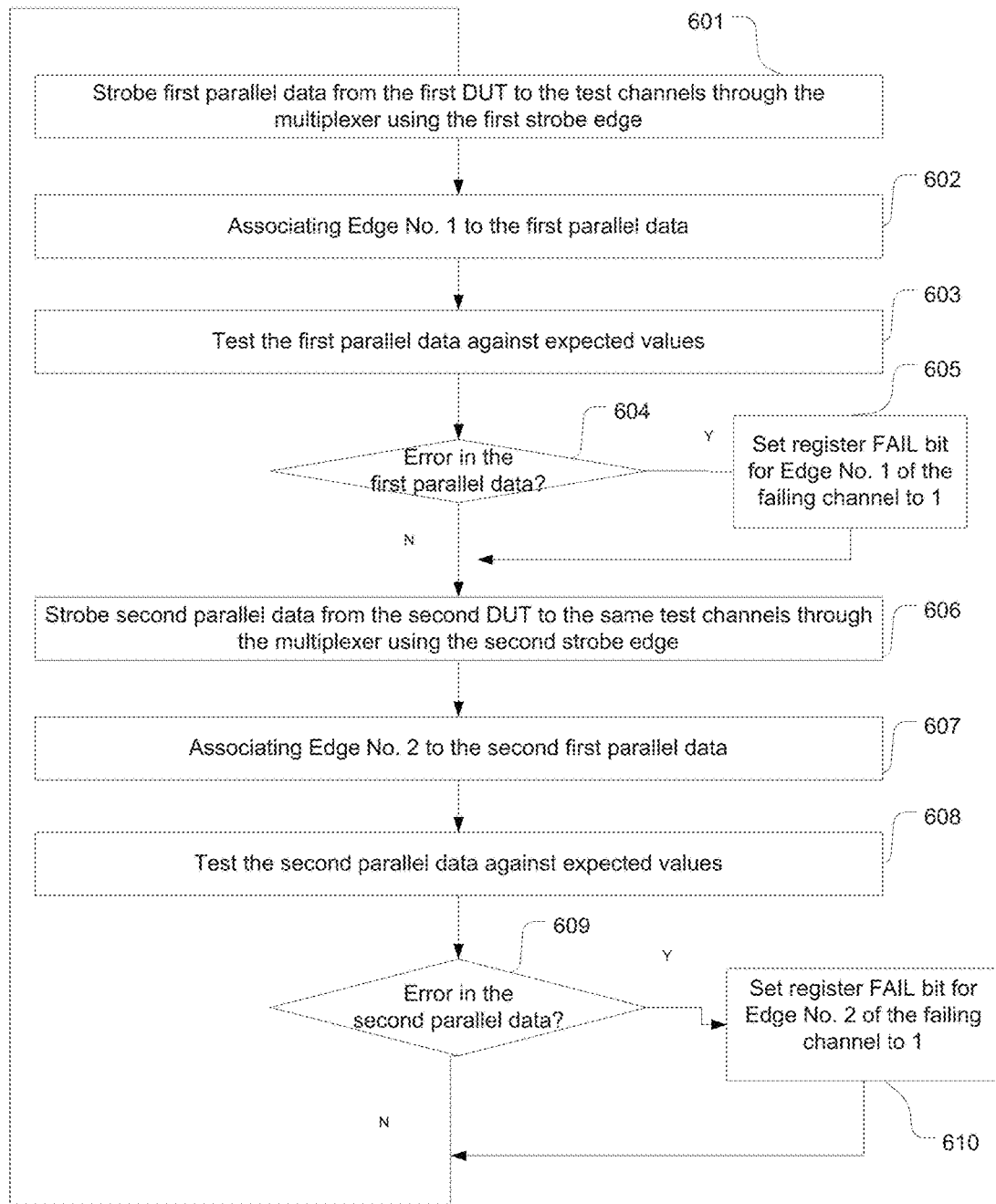
FIG. 6 illustrates an exemplary process of testing DUTs in a multi-site multiplexing test and identifying failing sites from interleaved data in accordance with an embodiment of the present disclosure.

FIG. 6 illustrates an exemplary process 600 of testing DUTs in a multi-site multiplexing test and identifying failing sites from interleaved data in accordance with an embodiment of the present disclosure. The process 600 may be performed by various component of a test system as shown in FIGS. 3 and 5. The process may be controlled by hardware logic, software logic or a combination thereof in the test system. At 601, the first parallel data from the first DUT is strobed to a plurality of channels through the multiplexer using the first strobe edge which is reserved exclusively for data from the first DUT as configured. The plurality of channels are allocated between the first DUT and the second DUT as described in greater detail above. During the strobing, the multiplexer only accesses parallel IO pins form the first DUT. The second DUT and the second test site are placed on hold during the strobing. In this example, strobe edge No. 1 is programmed to be associated with data from the first DUT as received by the test channels. Thus at 602, Edge No. 1 is associated with the first parallel data, e.g., as an identifier bit.

At 603, the first parallel data are tested against expected values. If an error occurs at a certain channel as determined at 604, the register FAIL bit for Edge No. 1 of the error/failing channel is set to 1 at 605. However, it will be appreciated that it does not matter if a logic 1 or logic 0 or alike is used for storage to represent "FAIL."

At 606, the second parallel data from the second DUT is strobed to the same plurality of test channels through the multiplexer using the second strobe edge which is reserved exclusively for data from the second DUT as configured. During the strobing, the multiplexer only accesses parallel IO pins form the second DUT. The first DUT and the first test site are placed on hold during this strobing. Strobe edge No. 2 is programmed to be associated with data from the second DUT as received by the test channels. Thus at 607, Edge No. 2 is associated with the second parallel data, e.g., as an identifier bit.

At 608, the second parallel data are tested against expected values. If an error occurs at a certain channel as determined at 609, the register FAIL bit for Edge No. 2 of the error/failing channel is set to 1 at 610. The foregoing 601-610 are repeated following each scan-in/out phase.

Figure 7:
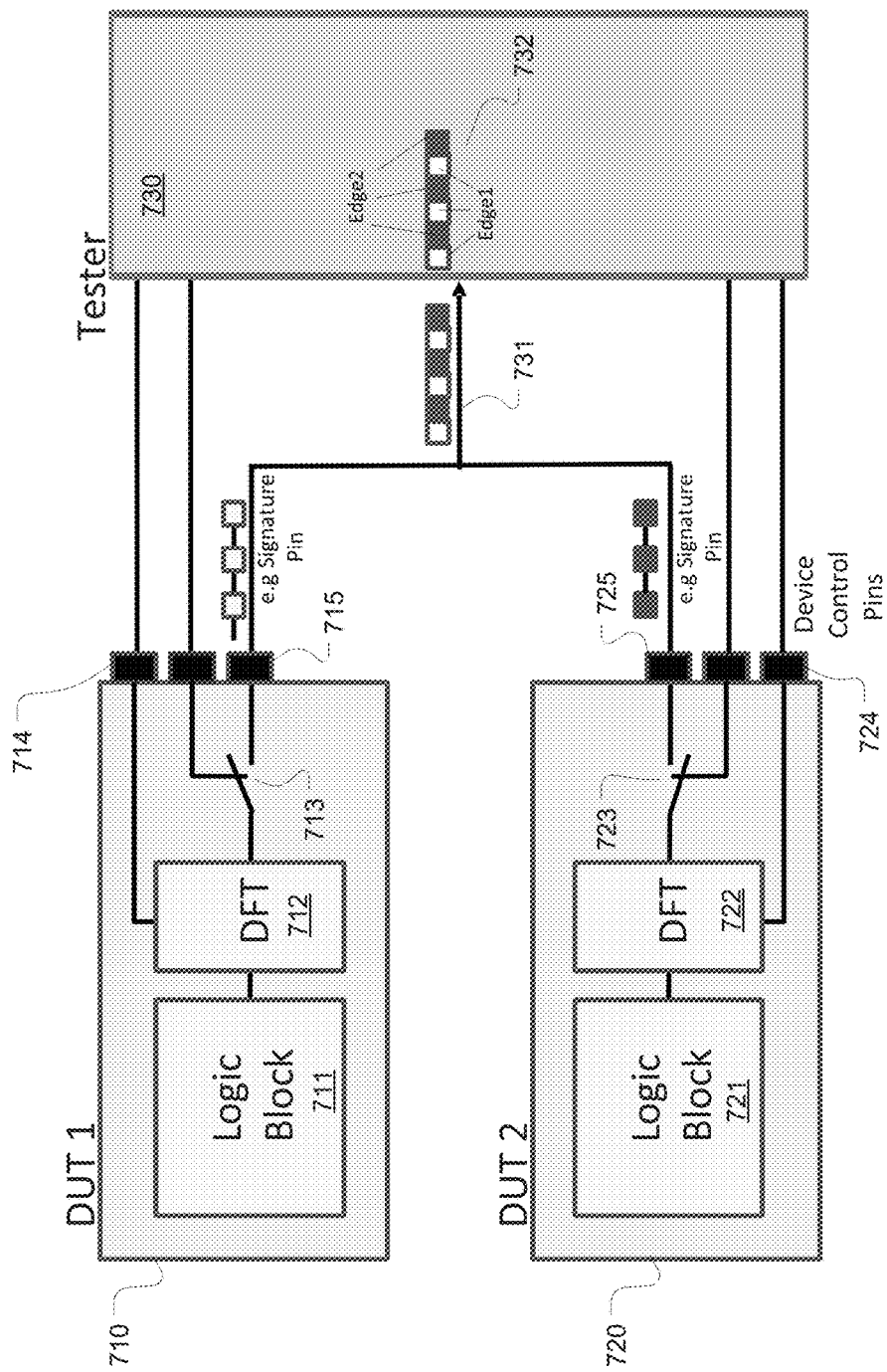
FIG. 7 illustrates the configuration of a test system utilizing programmable strobing edges to differentiate interleaved test results from multiple DUTs in accordance with an embodiment of the present disclosure.

In some other embodiments, rather than using an external multiplexer, data multiplexing can be realized using built-in chip select (or "device control") functions of the DUTs. FIG. 7 illustrates the configuration of a test system utilizing programmable strobing edges to differentiate interleaved test results from multiple DUTs 710 and 720 in accordance with an embodiment of the present disclosure.

As shown, a test channel 731 is coupled to a pin 715 in DUT 1 710 and a pin 725 in DUT 2 720. DUT 1 710 and DUT 2 720 are assigned to Edge No. 1 and 2 respectively (see 732). The pins 715 and 725 are coupled to the logic blocks 711 and 721, respectively. The DUT 1 710 and 2 720 are coupled to each other, e.g., through signature pins 715 and 725.

During testing, each DUT performs a task on a logical block, e.g., performing an embedded test using an embedded designs for testability (DFTs) 712 or 722. The test result of each DUT is sent as data or data packages and shifted in time by the control of the tester 730. Thus, the data packages of both DUTs are transmitted through the single path 731 in a time interleaved manner.

As controlled by the tester 730, the DUT 1 and DUT 2 are alternately set to an "active" state for strobing data to the tester 730 using different edges. For instance, when DUT 1 is active, DUT 2 pins are placed on hold, e.g., set to a high impedance state. The test results are interleaved but can be differentiated by using different edge numbers assigned thereto. It will be appreciate that the test is not limited to scan test but can be any test that is well known in the art.

In some other embodiments, the method of using different edges to identify a source of the failure can be used to identify a source of failure within a single DUT. In some of such embodiments, a multiplexer can be used to multiplex test data for different logic blocks (e.g., different logic IP) within the DUT, where each edge is assigned to a respective logic block. The DUT has a plurality of IO pin groups coupled respective logic blocks (or logic groups) of the DUT. The logic blocks can be tested in parallel but test data is strobed in the tester alternately. The plurality of IO pins groups may be selectively coupled to the test channels of a single test site through the multiplexer such that the different logic blocks alternately strobe data into the tester, resulting in interleaved test results. The interleaved test results can be differentiated by using the respective edge numbers assigned thereto. In this manner, the tester can evaluate the results, link the result back to a logical block and data log the test result per logical block.

The test system may include a user interface, e.g., a programmable interface, a graphical user interface, that can report the results of the register FAIL bits to users. Based on the readout of the registers, a failure site can be quickly identified.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An automated test equipment (ATE) system for testing devices under test (DUTs), said ATE system comprising:
    a first test site of said ATE system comprising a first plurality of channels operable to be allocated between first and second DUTs during parallel data capture wherein each of said first and second DUTs comprises a number of input/output (I/O) pins that is greater than the first plurality of channels;
    a second test site of said ATE system comprising a second plurality of channels operable to be allocated between said first and second DUTs during parallel data capture, wherein each of said first and second DUTs comprises a number of I/O pins that is greater than the second plurality of channels;

a multiplexer of said ATE system operable to selectively couple I/O pins of said first DUT or I/O pins of said second DUT to said first and second plurality of channels, wherein the multiplexer spans across the first test site and the second test site and is operable to allow an active test site to borrow channels from another site that is placed on hold; and tester logic of said ATE system operable to perform a test method, said test method comprising:

a) said first and second test sites performing scan operations in parallel wherein said first test site performs scan operations with respect to said first DUT and wherein said second test site performs scan operations with respect to said second DUT;

b) said first and second test sites performing scan capture of said first DUT while said second DUT is placed on hold and while further said multiplexer couples said first and second plurality of channels to said I/O pins of said first DUT; and c) said first and second test sites performing scan capture of said second DUT while said first DUT is placed on hold and while further said multiplexer couples said first and second plurality of channels to said I/O pins of said second DUT.

2. The ATE system as described in claim 1, wherein said test method further comprises repeating a) through c) during DUT testing.

3. The ATE system as described in claim 1 wherein said a) further comprises:

said first test site performing scan-in operations with said first DUT using a third plurality of channels dedicated to said first DUT; and said first test site performing scan-out operations with said first DUT using a portion of said first plurality of channels.

4. The ATE system as described in claim 3 wherein said a) further comprises:

said second test site performing scan-in operations with said second DUT using a fourth plurality of channels dedicated for said second DUT; and said second test site performing scan-out operations with said second DUT using a portion of said second plurality of channels.

5. The ATE system as described in claim 1 wherein said b) is performed responsive to a scan capture clock of said first DUT.

6. The ATE system as described in claim 5 wherein said c) is performed responsive to a scan capture clock of said second DUT.

7. The ATE system as described in claim 3 wherein a number of I/O pins of said first DUT is greater than said third plurality of channels.

8. An automated test equipment (ATE) system for testing devices under test (DUTs), said system comprising:

a first test site of said ATE system comprising: a first plurality of channels operable to be allocated between first and second DUTs; and a second plurality of channels operable to be used for said first DUT to perform scan operations, wherein each of said first and second DUTs comprises a number of input/output (I/O) pins that is greater than the first plurality of channels;

a second test site said ATE system comprising: a third plurality of channels operable to be allocated between said first and second DUTs; and a fourth plurality of channels operable to be used for said second DUT to perform scan operations;

a multiplexer said ATE system operable to selectively couple I/O pins of said first DUT or I/O pins of said second DUT to said first and third plurality of channels, wherein the multiplexer spans across the first test site and the second test site and is operable to allow an active test site to borrow channels from another site that is placed on hold; and tester logic operable to perform a test method, said test method comprising:

a) said first and second test sites performing scan operations in parallel wherein said first test site exclusively performs scan operations with respect to said first DUT and wherein said second test site exclusively performs scan operations with respect to said second DUT;

b) said first and second test sites performing scan capture of said first DUT while said second DUT is placed on hold and while further said multiplexer couples said first and third plurality of channels to said I/O pins of said first DUT; and c) said first and second test sites performing scan capture of said second DUT while said first DUT is placed on hold and while further said multiplexer couples said first and third plurality of channels to said I/O pins of said second DUT.

9. The ATE system as described in claim 8, wherein test method further comprises repeating a) through c) during DUT testing.

10. The ATE system as described in claim 8 wherein said a) further comprises:

said first test site performing scan-in operations with said first DUT using said second plurality of channels; and said first test site performing scan-out operations with said first DUT using a portion of said first plurality of channels.

11. The ATE system as described in claim 10 wherein said a) further comprises:

said second test site performing scan-in operations with said second DUT using said fourth plurality of channels; and said second test site performing scan-out operations with said second DUT using a portion of said third plurality of channels.

12. The ATE system as described in claim 8 wherein said b) is performed responsive to a scan capture clock of said first DUT.

13. The ATE system as described in claim 12 wherein said c) is performed responsive to a scan capture clock of said second DUT.

14. The ATE system as described in claim 8 wherein a number of I/O pins of said first DUT is greater than said third plurality of channels.

15. A method of testing a first and second DUT on an automated test equipment (ATE), said method comprising:

a first test site of said ATE, comprising a first plurality of channels, performing scan operations with respect to said first DUT;

a second test site of said ATE, comprising a second plurality of channels, performing scan operations with respect to said second DUT;

performing a first scan capture phase, responsive to a capture clock for said first DUT, said first scan capture phase comprising:

placing said second DUT in a hold state;

multiplexing channels of said first and second plurality of channels to I/O pins of said first DUT using a multiplexer operable to span across the first test site and the second test site and further operable to allow an active test site to borrow channels from another site that is placed on hold; and performing a scan capture operation on said first DUT utilizing said first and second test sites; and performing a second scan capture phase, responsive to a capture clock for said second DUT, said second scan capture phase comprising:
  placing said first DUT in a hold state;
  multiplexing channels of said first and second plurality of channels to I/O pins of said second DUT using said multiplexer; and
  performing a scan capture operation on said second DUT utilizing said first and second test sites.

16. The method as described in claim 15 wherein said performing scan operations with respect to said first DUT comprises:
  performing scan-in operations; and
  performing scan-out operations.

17. The method as described in claim 16 wherein said performing scan operations with respect to said second DUT comprises:
  performing scan-in operations; and
  performing scan-out operations.

18. The method as described in claim 15 wherein said performing scan operations with respect to said first DUT and said performing scan operations with respect to said second DUT are performed simultaneously.

19. The method as described in claim 15 wherein a number of I/O pins of said first DUT is greater than said first plurality of channels and said number of I/O pins of said first DUT is greater than said second plurality of channels.

20. The method as described in claim 15 wherein said performing scan operations with respect to said first DUT is performed exclusively by said first test site; and wherein further said performing scan operations with respect to said second DUT is performed exclusively by said second test site.

\* \* \* \* \*